United States Patent
Seshadri et al.

(10) Patent No.: US 12,150,298 B2
(45) Date of Patent: Nov. 19, 2024

(54) EFUSE PROGRAMMING FEEDBACK CIRCUITS AND METHODS

(71) Applicant: Texas Instruments Incorporated, Dallas, TX (US)

(72) Inventors: Anand Seshadri, Richardson, TX (US); Kemal Tamer San, Plano, TX (US); Sunil Kumar Dusa, Plano, TX (US); Michael Ball, Richardson, TX (US); Akram A. Salman, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 420 days.

(21) Appl. No.: 17/515,147

(22) Filed: Oct. 29, 2021

(65) Prior Publication Data

US 2023/0138308 A1    May 4, 2023

(51) Int. Cl.
| | | |
|---|---|---|
| *H01L 21/00* | (2006.01) | |
| *G11C 17/16* | (2006.01) | |
| *G11C 17/18* | (2006.01) | |
| *H01L 23/525* | (2006.01) | |
| *H10B 20/20* | (2023.01) | |

(52) U.S. Cl.
CPC ............ *H10B 20/20* (2023.02); *G11C 17/165* (2013.01); *G11C 17/18* (2013.01); *H01L 23/5256* (2013.01)

(58) Field of Classification Search
CPC ...... H10B 20/20; H10B 20/25; G11C 17/165; G11C 17/18; H01L 23/5256
See application file for complete search history.

(56) References Cited

U.S. PATENT DOCUMENTS

| | | | |
|---|---|---|---|
| 7,203,117 B2 | 4/2007 | Agata et al. | |
| 9,479,169 B1* | 10/2016 | Chou | G11C 17/16 |
| 2004/0085119 A1* | 5/2004 | Hokenmaier | G11C 17/18 |
| | | | 257/E21.595 |
| 2007/0090486 A1* | 4/2007 | Otsuka | H01L 23/5256 |
| | | | 257/E23.149 |
| 2010/0226193 A1* | 9/2010 | Yamauchi | G11C 17/18 |
| | | | 257/E29.325 |
| 2012/0275244 A1* | 11/2012 | Do | G11C 17/16 |
| | | | 365/189.11 |

(Continued)

*Primary Examiner* — Richard A Booth
(74) *Attorney, Agent, or Firm* — Andrew R. Ralston; Frank D. Cimino (57) ABSTRACT

An integrated circuit (IC), comprising a fuse structure (eFuse) formed in a resistive layer over a semiconductor substrate, the eFuse subject to a change in resistance through the controlled application of a programming current from a programming voltage source connected to a first terminal of the eFuse; a blow transistor formed on or over the substrate and having a control terminal configured to cause the programming current to flow through the eFuse in response to a programming signal; an intermediate transistor formed on or over the substrate and electrically coupled in series between a second terminal of the eFuse and the blow transistor; and, control circuitry formed on or over the substrate and electrically coupled to a node between the second terminal of the eFuse and the intermediate transistor, the control circuitry configured to reduce the flow of programming current through the eFuse in the event that a voltage detected at the node reaches a threshold level.

22 Claims, 6 Drawing Sheets

(56) References Cited

U.S. PATENT DOCUMENTS

2015/0325316 A1* 11/2015 Kang ................. G11C 29/76
365/96
2023/0238070 A1* 7/2023 Hirano ................ G11C 17/18
365/96

* cited by examiner

EFUSE PROGRAMMING FEEDBACK CIRCUITS AND METHODS

TECHNICAL FIELD

The disclosure is directed, in general, to integrated circuit (IC) electronic fuses (eFuse) and, more specifically, but not exclusively, to eFuse programming circuits and methods that compensate for variability of the magnitude and duration of a programming current sufficient to ensure a programmed eFuse has a desired resistance.

BACKGROUND

An integrated circuit (IC) is a set of electronic circuits on a small piece of semiconductor material, usually silicon. One type of IC is a read-only memory (ROM), which is a form of non-volatile memory (NVM) wherein the logical state of each bit (or memory element), either a "0" or "1", is fixed; data stored in ROM cannot be electronically modified after manufacture. A mask ROM is a read-only memory having contents that are programmed by the IC manufacturer, rather than the end user; the desired contents of the memory are typically provided to the manufacturer, and the desired contents are converted into a custom mask layer for the final metallization of interconnections on the memory chip. An alternative to a mask ROM is a programmable ROM (PROM), which allows for programming after manufacture. A typical PROM is manufactured with all memory elements, or bits, reading as "1"; during programming, "burning" (i.e., rupturing) an electronic fuse (eFuse) associated with a memory element causes that element to change to a state that will, instead, be read as "0".

An eFuse is essentially a two-terminal IC fuse structure with a first terminal typically connected to a voltage source and the second terminal connected to a switch; the switch is typically implemented using a NMOS transistor, wherein the second terminal of the eFuse is connected to the NMOS drain and the NMOS source is electrically connected to ground. To blow the eFuse, a pulse is applied to the gate of the NMOS transistor, enabling a high current to flow through the eFuse. The pulse is selected to have a duration generally sufficient to ensure that the eFuse is sufficiently ruptured, or at least sufficient to alter its resistance to a greater value.

SUMMARY

In order to address the deficiencies of the prior art, disclosed hereinafter is an integrated circuit (IC), comprising (1) a fuse structure (also referred to as an "eFuse") formed in a resistive layer over a semiconductor substrate, the fuse structure subject to a change in resistance through the controlled application of a programming current from a programming voltage source connected to a first terminal of the fuse structure; (2) a blow transistor formed on or over the substrate and having a control terminal configured to cause the programming current to flow through the fuse structure in response to a programming signal; (3) an intermediate transistor formed on or over the substrate and electrically coupled in series between a second terminal of the fuse structure and the blow transistor; and, (4) control circuitry formed on or over the substrate and electrically coupled to a node between the second terminal of the fuse structure and the intermediate transistor, the control circuitry configured to reduce the flow of programming current through the fuse structure when a voltage detected at the node reaches a threshold level.

The fuse structure can comprise, for example, a polysilicon layer and a silicide layer. Such fuse structures can be characterized by variability, due to process variations, of a magnitude and duration of programming current sufficient to change the resistance of the fuse structure to a desired value. Utilizing the disclosed circuits, a threshold level for a voltage detected at a node between the second terminal of the fuse structure and the intermediate transistor corresponds to a desired value. A programming current is caused to flow through the fuse structure and the intermediate transistor when the blow transistor is enabled, producing a voltage at that node that is a function of the programming current, the programming current varying inversely to the resistance of the fuse structure. The disclosed circuits terminate, or at least reduce, the programming current as a function of a threshold level corresponding to a desired resistance of the fuse structure.

Several circuit examples based on different configurations of the intermediate transistor are disclosed. In a first example, the intermediate transistor is a diode-configured transistor having a gate terminal and drain terminal electrically coupled to the second terminal of the fuse structure and a source terminal electrically coupled to a drain terminal of the blow transistor. In a second example, a drain terminal of the intermediate transistor is electrically coupled to the second terminal of the fuse structure, a source terminal is electrically coupled to a drain terminal of the blow transistor, and a gate terminal is electrically coupled to the control terminal of the blow transistor. In a third example, a drain terminal of the intermediate transistor is electrically coupled to the second terminal of the fuse structure, a source terminal is electrically coupled to a drain terminal of the blow transistor, and a gate terminal is electrically coupled to a bias voltage source. The bias voltage source can be derived from the programming voltage source.

For all configurations of the second transistor, several control circuitry examples are also disclosed. In a first control circuitry example, the control circuitry is operable to reduce the programming current by terminating the programming signal applied to the control terminal of the blow transistor. In a second control circuitry example, the IC further comprises a shunt transistor on the substrate electrically coupled in parallel with the fuse structure and the control circuitry is operable to reduce the flow of current through the fuse structure by enabling the shunt transistor until at least the termination of the programming signal applied to the control terminal of the blow transistor. In a third control circuitry example, the control circuitry is operable to reduce the flow of current through the fuse structure by reducing the voltage provided by the programming voltage source.

The foregoing has outlined, rather broadly, the principles of the disclosed embodiments so that those skilled in the art may better understand the detailed description of the example embodiments that follow. Those skilled in the art should appreciate that they can readily use the disclosed conception and example embodiments as a basis for designing or modifying other structures and methods for carrying out the same purposes of the present disclosure. Those skilled in the art should also realize that such equivalent constructions do not depart from the spirit and scope of the disclosure in its broadest form.

BRIEF DESCRIPTION OF THE DRAWINGS

For a more complete understanding of the disclosure, reference is made to the following detailed description taken in conjunction with the accompanying drawings, in which:

FIGS. 2-A, 2-B and 2-C illustrate example functional schematics for eFuse circuits, and corresponding voltage and current plots, in accordance with the disclosed principles;

FIGS. 3-A, 3-B and 3-C illustrate example control schemes for use with the eFuse circuits illustrated in FIGS. 2-A, 2-B and 2-C; and, FIG. 4 illustrates an example timing diagram for the control schemes illustrated in FIGS. 3-A, 3-B and 3-C.

DETAILED DESCRIPTION

It has been observed using inductive current probes that, during a transient eFuse blow process, an eFuse can randomly transition between a state of rupture (i.e., exhibiting a high resistance) and re-formation (i.e., lower resistance) until, due to an appropriate combination of pulse duration, source voltage applied to the eFuse and current flow through the NMOS transistor (and eFuse unless fully ruptured), the eFuse is permanently ruptured. Because the pulse applied to the gate of the NMOS transistor has a predefined duration, and the source voltage is typically fixed, there can exist conditions favorable to re-formation of the eFuse (e.g., that can leave a fuse in a partially ruptured state, or worse, in a state that is prone to regrowth over its product lifetime). Accordingly, there is a need in the art for circuits and methods to inhibit the re-formation of an eFuse during the blow process and control the blow process to yield an altered eFuse having a resistance of a desired value.

Figure 1:
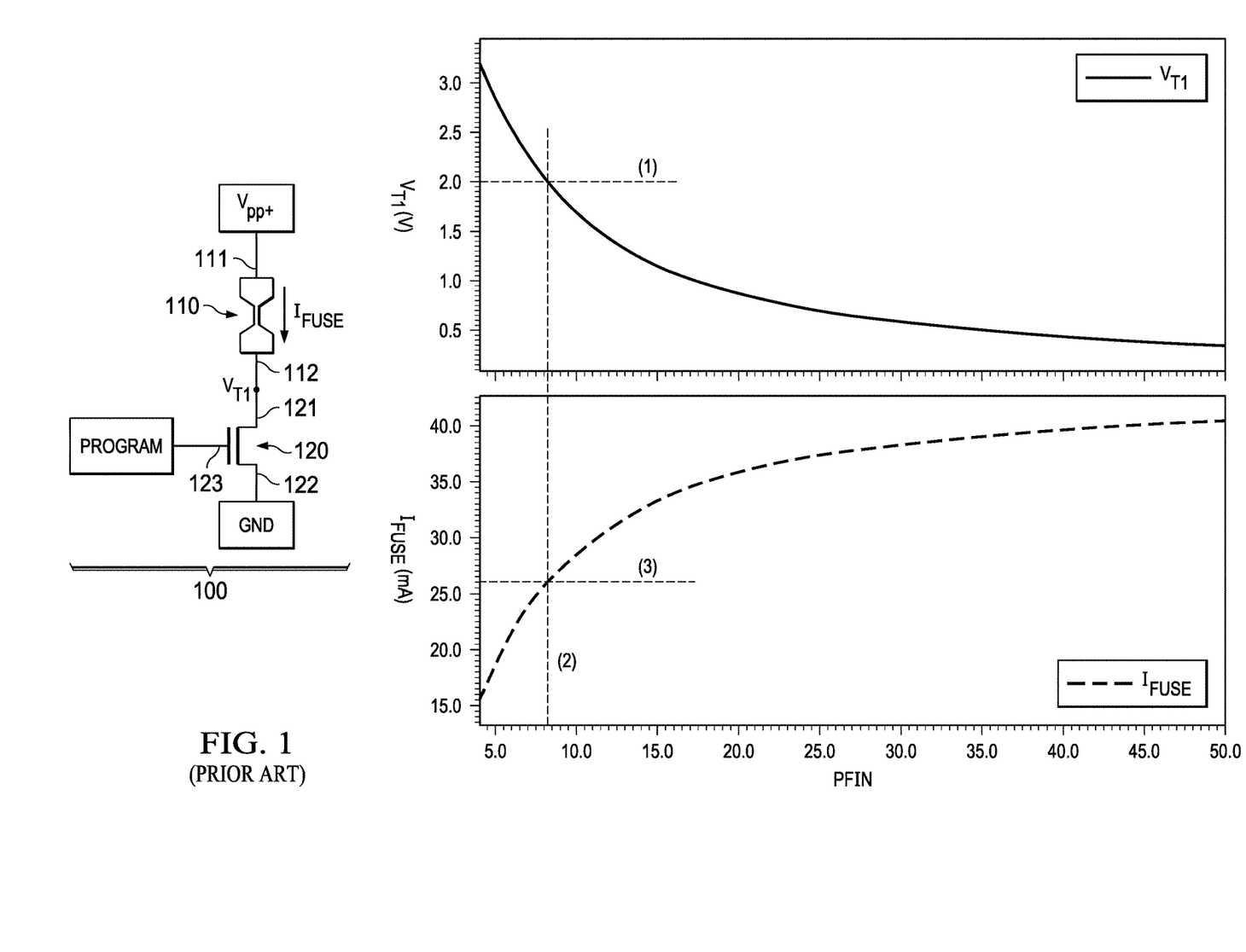
FIG. 1 illustrates a prior art eFuse and associated blow transistor circuit and corresponding voltage and current plots.

FIG. 1 illustrates a baseline eFuse circuit 100 and associated voltage and current plots. The eFuse circuit 100 includes an eFuse 110 coupled in series with a "blow transistor" 120. The eFuse 110 has a first terminal 111 couplable to a programming voltage ($V_{PP}$) source and is characterized by variability (e.g., of a magnitude and duration of a programming current sufficient to increase the resistance of the eFuse to a desired value). In an example, the eFuse 110 is formed as a polycrystalline silicon having a resistance in the range of 100-200Ω. The eFuse 110 illustrates a configuration sometimes referred to as a "dog bone", in which a central narrow portion is located between two wider terminals. The central portion may be unsilicided such that current is only conducted by polysilicon, whereas the end portions may be silicided to provide low resistance and an ohmic connection to an interconnect circuit. After being altered, due to programming, the eFuse will be at least partially ruptured and have a greater resistance.

The blow transistor 120 has a first terminal 121 coupled to a second terminal 112 of the eFuse and a second terminal 122 coupled to ground (GND). A control terminal 123 is operable to receive a programming signal to enable the blow transistor, causing a programming current ($I_{FUSE}$) to flow through the eFuse 110. In some examples, the blow transistor 120 is an N-channel metal-oxide semiconductor (NMOS) transistor, wherein control terminal 123 is the "gate" terminal, terminal 121 is the "drain" terminal, and terminal 122 is the "source" terminal.

The time required for programming an eFuse is typically several hundred nano-seconds (ns) to several micro-seconds (μs), and the magnitude of the programming current can be several tens of milliamps (mA). In one programming technique, a current is caused to flow through an eFuse for a predetermined time and the programming process is periodically stopped to determine whether the resistance value of the eFuse has reached a desired value; if not, the process is repeated. An improvement to that process is to monitor a voltage at the junction between the eFuse 110 and blow transistor 120 and to terminate the process when it reaches a predetermined level. The predetermined voltage level is associated with a desired value for the resistance of the eFuse. See, for example, U.S. Pat. No. 7,203,117, incorporated herein by reference.

To reliably blow an eFuse, a blow transistor of sufficient strength (e.g., "width") is required in order to sink a sufficient current (e.g., at least 40 mA). At initiation of the blow process, the choice of sufficient transistor strength can cause the voltage ($V_{T1}$) at the junction between eFuse 110 and blow transistor 120 to be very close (or even below) the threshold (e.g., 2 V) of a conventional logic gate used to detect $V_{T1}$; in other words, the monitored voltage is simply the drain-to-source voltage (VDs) across the blow transistor 120. Thus, the baseline scheme may require a weak blow transistor in order to build up a $V_{T1}$ voltage that is safely higher than the input threshold of the detecting logic gate such that, when the eFuse is altered, $V_{T1}$ will drop below the threshold and initiate the necessary signal to turn off the blow transistor 120. Placing an upper limit on the blow transistor strength, however, reduces the programming current, which can compromise eFuse blow yield and reliability. This can be seen in the graphs of $V_{T1}$ and $I_{FUSE}$ shown in FIG. 1; when a voltage detection circuit limits $V_{T1}$ to be 2 V (Graph reference 1), the transistor strength (measured as number of unit transistor fingers, PFIN) is limited to 8 PFIN (Graph Reference 2), which limits the fuse blow current to approximately 26 mA (Graph Reference 3), significantly less than the desired programming current of 40 mA. A "unit" finger of the transistor can be, for example, 5 μm in width, with a drive current of approximately 600 μA/μm or 3 mA per finger.

To compensate for a weak blow transistor, the programming voltage ($V_{PP}$) can be raised. That voltage level, however, is limited by the transistor breakdown (e.g., drain-source "punch-through") and affects operation and/or reliability, also referred to as "safe operating area" (SOA). Examples disclosed herein provide a solution to this problem by inserting a transistor in series between the eFuse 110 and the blow transistor 120, ensuring that the voltages across the transistors can be within SOA.

Figure 2:
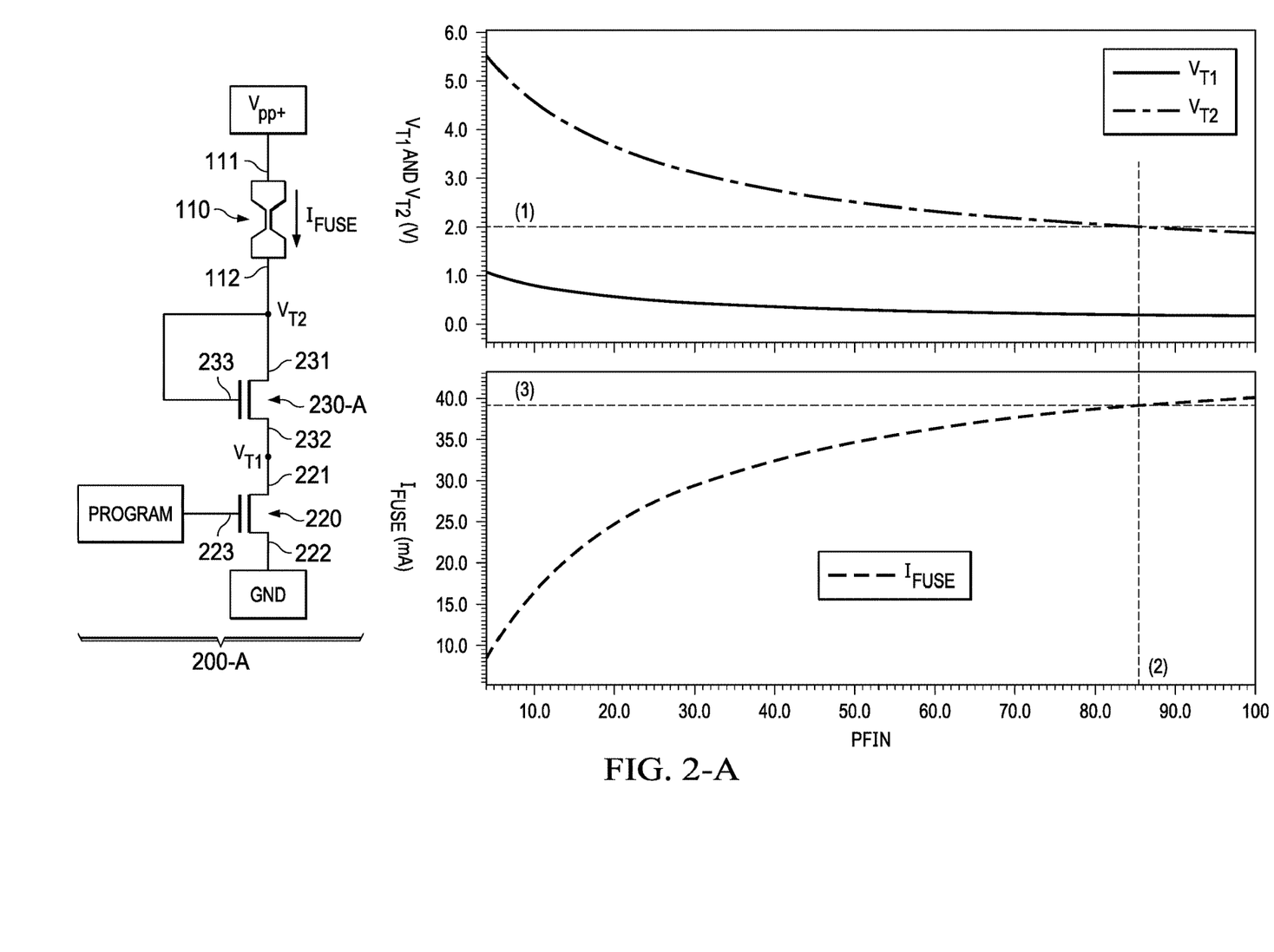

Turning now to FIGS. 2-A, 2-B and 2-C, illustrated are functional schematics for example eFuse blow circuits 200-A, 200-B, and 200-C, and associated voltage and current plots, in accordance with the principles of the disclosure. Each of the eFuse blow circuits 200-A, 200-B, and 200-C may be implemented in an integrated circuit (IC) that includes one or more instances of eFuse 100, for example for nonvolatile storage of trim values or serving other local memory needs in the IC. The components of the circuit may be implemented in, on or over a semiconductor substrate such as a silicon wafer or die (not explicitly shown). The example eFuse blow circuits 200-A, 200-B, and 200-C are each characterized by a second (or "intermediate") transistor (230-A, 230-B, and 230-C, respectively) coupled in series between the eFuse 110 and blow transistor 120. Connections between the eFuse 110, and transistors 220, 230 may be made by metal interconnects over the substrate. A programming current caused to flow through the eFuse 110 and the intermediate transistor when the blow transistor is enabled produces a voltage ($V_{T2}$) at the second terminal 112 of the eFuse that is a function of the programming current; e.g., the programming current being inversely proportion to the resistance of the eFuse 110.

In a first example, as illustrated in FIG. 2-A, the intermediate transistor coupled in series between the eFuse 110 and blow transistor 220 is a diode-configured transistor 230-A having a gate terminal 233 and drain terminal 231 coupled to the second terminal 112 of eFuse 110, with the source terminal 232 coupled to the drain terminal 221 of the blow transistor 220. In the illustrated example, and the following examples, the blow transistor 220 and the intermediate transistor 230 are shown as NMOS transistors without implied limitation. In some other examples, one or both of the transistors 220, 230 may be implemented as PMOS transistors. The voltage ($V_{T1}$) developed at the terminal between the eFuse 110 and blow transistor 120 as illustrated in FIG. 1 is now the voltage developed at the circuit node between the source terminal 232 of intermediate transistor 230-A and the drain terminal 221 of blow transistor 220, while the voltage developed at the circuit node between the eFuse 110 and the drain terminal 231 of the intermediate transistor 230-A is $V_{T2}$. As shown in the accompanying graphs of $V_{T1}$, $V_{T2}$ and $I_{FUSE}$ in FIG. 2-A, for $V_{T2}$ equal to 2 V (Graph reference 1), the transistor strength (measured as number of unit transistor fingers, PFIN) is approximately 86 PFIN (Graph Reference 2), which is suitably wide to allow the eFuse blow current $I_{FUSE}$ to be approximately the desired minimum programming current of 40 mA (Graph Reference 3). As can be seen, $V_{T1}$ is below 2 V well below the desired $I_{FUSE}$ minimum 40 mA blow current for nearly all transistor strengths, which would make it unsuitable as a trigger to terminate the eFuse programming process. In contrast, $V_{T2}$ remains above 2V while supplying the 40 mA current required to ensure the eFuse resistance is increased to a desired value for programming.

In a second example, as illustrated in FIG. 2-B, the intermediate transistor 230-B is coupled with blow transistor 220 in a first "cascode" transistor configuration. In this arrangement, the drain terminal 231 of the intermediate transistor 230-B is conductively connected to the second terminal of the eFuse 110, the source terminal 232 is conductively connected to the drain terminal 221 of the blow transistor 220, and the gate terminal 233 is conductively connected to a bias voltage source 240. The bias voltage source 240 can be, for example, derived from the $V_{PP}$ programming voltage source (e.g., $V_{PP}/2$). The voltage ($V_{T1}$) developed at the circuit node between the eFuse 110 and the drain terminal 121 of the blow transistor 120 as illustrated in FIG. 1 is now the voltage developed at the circuit node between the source terminal 232 of the intermediate transistor 230-B and the drain terminal 221 of blow transistor 220, while the voltage developed at the terminal between eFuse 110 and the intermediate, cascode-configured, transistor 230-B is $V_{T2}$. As shown in the accompanying graphs of $V_{T1}$, $V_{T2}$ and $I_{FUSE}$ in FIG. 2-B, for $V_{T2}$ equal to 2 V (Graph reference 1), the transistor strength (measured as number of unit transistor fingers, PFIN) is approximately 46 PFIN (Graph Reference 2), which is suitably wide to allow the eFuse blow current $I_{FUSE}$ to be approximately the desired minimum programming current of 40 mA (Graph Reference 3). As can be seen, $V_{T1}$ is below 2 V for all transistor strengths, which would make it unsuitable as a trigger to terminate the eFuse programming process. In contrast, $V_{T2}$ remains above 2V while supplying the 40 mA programming current required to ensure the eFuse resistance is increased to a desired value for programming.

In a third example, as illustrated in FIG. 2-C, the intermediate transistor 230-C is coupled with blow transistor 220 in a second "cascode" transistor configuration. In this arrangement, the drain terminal 231 of the intermediate transistor 230-C is coupled to the second terminal of the eFuse 110, the source terminal 232 is coupled to the drain terminal 221 of the blow transistor 220, and the gate terminal 233 is coupled to the gate terminal 223 of blow transistor 220. The voltage ($V_{T1}$) developed at the circuit node between the eFuse 110 and the drain terminal 121 of the blow transistor 120 as illustrated in FIG. 1 is now the voltage developed at the circuit node between the source terminal 232 of the intermediate transistor 230-C and the drain terminal 221 of blow transistor 220, while the voltage developed at the circuit node between eFuse 110 and the drain terminal 231 of intermediate transistor 230-C is $V_{T2}$. As shown in the accompanying graphs of $V_{T1}$, $V_{T2}$ and $I_{FUSE}$ in FIG. 2-C, for $V_{T1}$ equal to 2 V (Graph reference 1), the transistor strength (measured as number of unit transistor fingers, PFIN) is approximately 20 PFIN (Graph Reference 2), which is suitably wide to allow the eFuse blow current $I_{FUSE}$ to be approximately the desired minimum programming current of 40 mA (Graph Reference 3). As can be seen, $V_{T1}$ is again below 2 V for all transistor strengths, which would make it unsuitable as a trigger to terminate the eFuse programming process. In contrast, $V_{T2}$ remains above 2V while supplying the 40 mA programming current required to ensure the eFuse resistance is increased to a desired value for programming.

Figure 3:
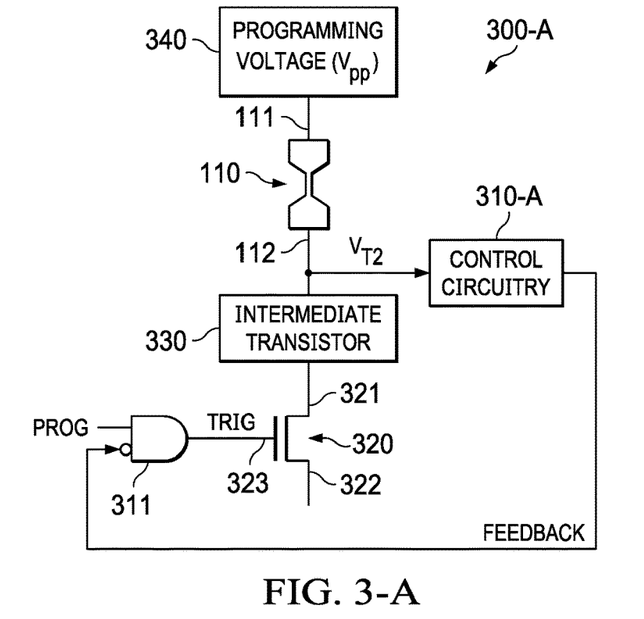

Turning now to FIGS. 3-A, 3-B and 3-C, illustrated are eFuse blow circuits, such as those illustrated in FIGS. 2-A, 2-B and 2-C, with additional control schemes 300-A, 300-B, and 300-C, respectively. In these examples, the intermediate transistor is represented by a stacked transistor 330 coupled between eFuse 110 and blow transistor 320. Each control scheme can be used with any of the circuits 200-A, 200-B, and 200-C illustrated in FIGS. 2-A, 2-B and 2-C. In other words, the control schemes are agnostic to the configuration of intermediate transistor 330, whether implemented as a diode-configured transistor 230-A or a cascode-configured transistor 230-B or 230-C. The eFuse blow circuit and control circuitry, or portions thereof, can be formed in, on or over a semiconductor substrate.

In general, the control circuitry is operable to detect the voltage at the circuit node between the second terminal of the eFuse 110 and the intermediate transistor 330, and to reduce the flow of programming current through the eFuse 110 when the voltage reaches a threshold level, the threshold level corresponding to a desired value for the resistance of the eFuse. Preferably, the threshold level corresponds to an input voltage threshold of a logic gate of the control circuitry, ensuring that the resistance of a programmed eFuse is at a desired level. This can be implemented by sensing the voltage with an inverter that has been ratioed to have a low threshold of switching in order to allow for the strongest possible blow transistor. The inverter should preferably only trip when the detected voltage goes below a low threshold, but at the same time have sufficient margin to allow for a high blow current that would result in a lower voltage on the detect node immediately after the blow process starts. The voltage detect inverter output can be input to a flip-flop. When the programming voltage $V_{PP}$ is supplied, $V_{T2}$ is at $V_{PP}$ since the blow transistor 320 is off. Therefore, the inverter output is "0". The flip-flop remains cleared until a control signal derived from PROG releases the flip-flop from clear. After programming is initiated, the flip-flop waits on the output of the inverter for a rising edge to set the flip-flop output to "1", which initiates feedback control, overriding the programming PROG signal and turning off the blow transistor, turning on a shunt transistor, or modulating the programming voltage, as illustrated and described below with reference to FIGS. 3-A, 3-B and 3-C, respectively. Ending the current flow through the eFuse 110 after altering the desired resistance of the eFuse has the advantage of limiting power dissipation in the integrated circuit and thereby reducing the possibility of collateral damage that could result in yield loss and/or field failures of the integrated circuit.

Figure 4:
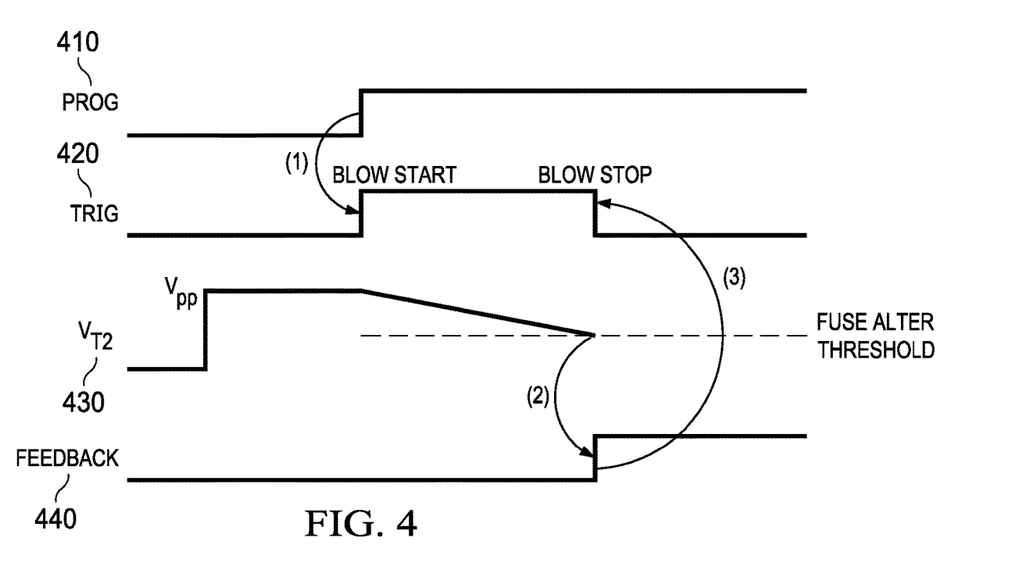

In a first example 300-A of the example control schemes, illustrated in FIG. 3-A, the control circuitry 310-A is operable to reduce the programming current through eFuse 110 by terminating the signal applied to the control terminal 323 of the blow transistor 320 via an AND gate 311. The operation of this control scheme can be understood with reference to the timing diagram illustrated in FIG. 4. In this example, prior to receipt of the PROG signal 410, the programming voltage $V_{PP}$ (340) applied to the first terminal 111 of eFuse 110 is enabled, which causes the sensed voltage $V_{T2}$ (430) intermediate to the eFuse 110 and intermediate transistor 330 to rise to $V_{PP}$. The eFuse programming process is then triggered with receipt of the programming signal (PROG) 410 at a first input of the AND gate 311. When the programming signal 410 is received (1), directly or indirectly, blow transistor 320 turns on (i.e., "blow start"), thereby causing a programming current to flow through eFuse 110 and the intermediate transistor 330. As the programming current flows through the eFuse 110, the resistance of the eFuse progressively increases and, thus, $V_{T2}$ decreases and, upon reaching a threshold level ("fuse alter threshold"), the control circuitry triggers the termination of the programming process (e.g., "blow stop"). In the scheme illustrated in FIG. 3-A, the PROG signal is provided to a non-inverting input of AND gate 311 and a nominally-low feedback signal (FEEDBACK) from control circuitry 310-A is provided to an inverting input of AND gate 311. When the PROG signal goes high, the output (TRIG) of AND gate 311 also goes high (1) and enables blow transistor 320. When $V_{T2}$ decreases to the desired level (e.g., "fuse alter threshold"), the control circuitry 310-A raises the FEEDBACK signal 440 to a logic high (2), which causes the output of AND gate 311 (TRIG) to go low (3), thereby turning off blow transistor 320 (i.e., "blow stop").

In alternative control scheme examples, the blow transistor 320 is not turned off in response to the voltage $V_{T2}$ decreasing to the fuse alter threshold. In a first such alternative control scheme example 300-B, illustrated in FIG. 3-B, the IC further includes a shunt transistor 350 coupled in parallel with terminals 111 and 112 of eFuse 110. The control circuitry 310-B is operable to reduce the flow of current through the eFuse by enabling the shunt transistor 350 when the voltage ($V_{T2}$) sensed at the circuit node between the second terminal 112 of the eFuse 110 and the intermediate transistor 330 falls to the fuse alter threshold. By shunting the available current around the eFuse 110, rather than through it, further change in the resistance of the eFuse is inhibited. The control circuitry 310-B can enable the shunt transistor 350 by applying a suitable feedback signal (FEEDBACK) to its gate terminal 353. Finally, in a second alternative control scheme example 300-C, illustrated in FIG. 3-C, the control circuitry 310-C is operable to reduce the flow of current through the eFuse 110 by reducing the programming voltage ($V_{PP}$) 340 applied to the first terminal 111 of eFuse 110. The FEEDBACK signal can be utilized to signal to the programming voltage source 340 to reduce the $V_{PP}$ voltage. For all control schemes, the PROG signal should have a preset duration that is known to be the longest potential duration necessary to alter the resistance of eFuse 110 for the purpose of programming.

The technical principles disclosed herein provide a foundation for designing eFuse programming circuits that provide the capability to compensate for variability of the duration and magnitude of a programming current sufficient to ensure a desired value for the resistance of the eFuse. The examples presented herein illustrate the application of the technical principles and are not intended to be exhaustive or to be limited to the specifically-disclosed circuit topologies; it is only intended that the scope of the technical principles be defined by the claims appended hereto, and their equivalents.

We claim:

1. An integrated circuit (IC), comprising:
a fuse structure formed in a resistive layer over a semiconductor substrate, said fuse structure subject to a change in resistance through the controlled application of a programming current from a programming voltage source connected to a first terminal of said fuse structure;
a blow transistor formed on or over said substrate and having a control terminal configured to cause said programming current to flow through said fuse structure in response to a programming signal;
an intermediate transistor formed on or over said substrate and electrically coupled in series between a second terminal of said fuse structure and said blow transistor; and,
control circuitry formed on or over said substrate and electrically coupled to a node between said second terminal of said fuse structure and said intermediate transistor, said control circuitry configured to reduce the flow of said programming current through said fuse structure in the event that a voltage detected at said node reaches a threshold level.

2. The IC recited in claim 1, wherein said fuse structure is characterized by variability of a magnitude and duration of said programming current sufficient to change the resistance of said fuse structure to a desired value and said threshold level corresponds to said desired value.

3. The IC recited in claim 2, wherein a programming current caused to flow through said fuse structure and said intermediate transistor in the event that said blow transistor is enabled will produce a voltage at said node that is a function of said programming current, said programming current varying inversely to said resistance of said fuse structure.

4. The IC recited in claim 1, wherein said intermediate transistor is a diode-configured transistor having a gate terminal and drain terminal electrically coupled to said second terminal of said fuse structure and a source terminal electrically coupled to a drain terminal of said blow transistor.

5. The IC recited in claim 1, wherein a drain terminal of said intermediate transistor is electrically coupled to said second terminal of said fuse structure, a source terminal is electrically coupled to a drain terminal of said blow transistor, and a gate terminal is electrically coupled to said control terminal of said blow transistor.

6. The IC recited in claim 1, wherein a drain terminal of said intermediate transistor is electrically coupled to said second terminal of said fuse structure, a source terminal is electrically coupled to a drain terminal of said blow transistor, and a gate terminal is electrically coupled to a bias voltage source.

7. The IC recited in claim 6, wherein said bias voltage source is derived from said programming voltage source.

8. The IC recited in claim 1, wherein said control circuitry is operable to reduce said programming current by terminating said programming signal applied to said control terminal of said blow transistor.

9. The IC recited in claim 1, further comprising forming a shunt transistor on said substrate electrically coupled in parallel with said fuse structure and said control circuitry is operable to reduce the flow of current through said fuse structure by enabling said shunt transistor until at least the termination of said programming signal applied to said control terminal of said blow transistor.

10. The IC recited in claim 1, wherein said control circuitry is operable to reduce the flow of current through said fuse structure by reducing the voltage provided by said programming voltage source.

11. The IC recited in claim 1, wherein said fuse structure comprises a polysilicon layer and a silicide layer.

12. A method of forming an integrated circuit (IC), comprising:
forming a fuse structure in a resistive layer over a semiconductor substrate, said fuse structure subject to a change in resistance through the controlled application of a programming current from a programming voltage source when coupled to a first terminal of said fuse structure;
forming a blow transistor on or over said substrate having a control terminal for receiving a programming signal to enable said blow transistor, whereby said programming current is caused to flow through said fuse structure;
forming an intermediate transistor on or over said substrate and electrically coupled in series between a second terminal of said fuse structure and said blow transistor; and,
forming control circuitry on or over said substrate and electrically coupled to a node between said second terminal of said fuse structure and said intermediate transistor, said control circuit configured to reduce the flow of said programming current through said fuse structure in the event that a voltage detected at said node reaches a threshold level.

13. The method recited in claim 12, wherein said fuse structure is characterized by variability of a magnitude and duration of said programming current sufficient to change the resistance of said fuse structure to a desired value and said threshold level corresponds to said desired value.

14. The method recited in claim 13, wherein a programming current caused to flow through said fuse structure and said intermediate transistor in the event that said blow transistor is enabled produces a voltage at said node that is a function of said programming current, said programming current being inversely proportion to said resistance of said fuse structure.

15. The method recited in claim 12, wherein said intermediate transistor is a diode-configured transistor having a gate terminal and drain terminal electrically coupled to said second terminal of said fuse structure and a source terminal electrically coupled to a drain terminal of said blow transistor.

16. The method recited in claim 12, wherein a drain terminal of said intermediate transistor is electrically coupled to said second terminal of said fuse structure, a source terminal is electrically coupled to a drain terminal of said blow transistor, and a gate terminal is electrically coupled to said control terminal of said blow transistor.

17. The method recited in claim 12, wherein a drain terminal of said intermediate transistor is electrically coupled to said second terminal of said fuse structure, a source terminal is electrically coupled to a drain terminal of said blow transistor, and a gate terminal is electrically coupled to a bias voltage source.

18. The method recited in claim 17, wherein said bias voltage source is derived from said programming voltage source.

19. The method recited in claim 12, wherein said control circuitry is operable to reduce said programming current by terminating said programming signal applied to said control terminal of said blow transistor.

20. The method recited in claim 12, further comprising forming a shunt transistor on said substrate electrically coupled in parallel with said fuse structure and said control circuitry is operable to reduce the flow of current through said fuse structure by enabling said shunt transistor until at least the termination of said programming signal applied to said control terminal of said blow transistor.

21. The method recited in claim 12, wherein said control circuitry is operable to reduce the flow of current through said fuse structure by reducing the voltage provided by said programming voltage source.

22. The method recited in claim 12, wherein said fuse structure comprises a polysilicon layer and a silicide layer.

* * * * *